United States Patent [19]

Matsumoto et al.

[11] Patent Number: 5,465,044
[45] Date of Patent: Nov. 7, 1995

[54] ANALOG MULTIPLYING-AVERAGING CIRCUIT AND WATTMETER CIRCUIT USING THE CIRCUIT

[76] Inventors: Yoshimitsu Matsumoto, 22-1-404, Konakadai 8-chome, Inage-ku, Chiba-shi, Chiba 263, Japan; Toshiaki Kansaku, 123-8, Nanabayashico, Hunabashi-shi, Chiba 274, Japan

[21] Appl. No.: 353,951

[22] Filed: Dec. 12, 1994

Related U.S. Application Data

[63] Continuation of Ser. No. 980,785, filed as PCT/JP90/0114, Aug. 31, 1990, abandoned.

[30] Foreign Application Priority Data

Aug. 27, 1990 [JP] Japan ................................. 2-224671

[51] Int. Cl.$^6$ ............................. G01R 11/32; G06G 7/16
[52] U.S. Cl. ............................ 324/142; 364/841; 327/356
[58] Field of Search ................................. 324/140, 141, 324/142, 106, 105; 364/481, 482, 483, 841, 842; 327/356, 362, 350

[56] References Cited

U.S. PATENT DOCUMENTS

| | | | |
|---|---|---|---|
| 4,156,283 | 5/1979 | Gilber | 327/350 |
| 4,454,433 | 6/1984 | Welland | 327/356 |
| 4,818,934 | 4/1989 | Tamamura | 324/158 T |
| 4,920,312 | 4/1990 | Maruyama | 324/142 |
| 5,017,860 | 5/1991 | Germer et al. | 324/142 |
| 5,151,624 | 9/1992 | Stepherr et al. | 327/356 |

FOREIGN PATENT DOCUMENTS

| | | |
|---|---|---|
| 53-40738 | 4/1978 | Japan . |
| 62-7510 | 2/1987 | Japan . |

*Primary Examiner*—Vinh P. Nguyen
*Attorney, Agent, or Firm*—Helfgott & Karas

[57] ABSTRACT

In an analog multiplying-averaging circuit for detecting very small mean power in a wide band and a wattmeter using the circuit, a first voltage signal is inputted to a base and a second voltage signal is inputted to a collector of one transistor circuit of a first differential amplifier, to supply a power corresponding to the multiplying-averaging of the two input signals to the collector of the transistor circuit. A base and a collector of another transistor circuit of the first amplifier are grounded to extract a DC collector voltage corresponding to junction temperature differences produced between the two transistor circuits from the collector of the other transistor circuit. A second amplifier is provided, which also has two transistor circuits. A base of one transistor circuit of the second differential amplifier is grounded. The second voltage signal is inputted to a collector of the one transistor circuit, and a base and a collector of another transistor circuit of the second amplifier are grounded to also extract a DC collector voltage corresponding to junction temperature differences of the two transistor circuits from the collector of the other transistor circuit of the second amplifier. From the two DC collector voltages, a signal corresponding to the multiplying-averaging of two input signals is obtained.

3 Claims, 6 Drawing Sheets

ANALOG MULTIPLYING-AVERAGING CIRCUIT AND WATTMETER CIRCUIT USING THE CIRCUIT

This is a continuation of application Ser. No. 07/980,785, filed as PCT/JP90/0114, Aug. 31, 1990, now abandoned.

TECHNICAL FIELD

This invention relates to an analog multiplying-averaging circuit and a wattmeter circuit using the circuit and, more particularly, to an analog multiplying-averaging circuit capable of detecting very small mean power in a wide band and a wattmeter circuit using said circuit therein.

BACKGROUND ART

An action for multiplying two input signals v(t), i(t) is essential in order to measure AC mean power, by way of example. In the prior art, an electrodynamometer type of wattmeter has been used for that purpose. But this type of wattmeter comprises a fixed coil and a movable coil and carries out mechanical action for multiplication, and in addition an error is generated due to reactance inside the wattmeter and the error changes according to a power factor of a load or a frequency, so that a compact wattmeter for a broad band is hardly available.

Also there is a wattmeter circuit which uses so-called an analog multiplier IC and outputs an instantaneous voltage e(t) corresponding to v(t)×i(t), but the circuit is extremely complicated and expensive, and furthermore the following calculation must be carried out separately outside:

$$P = \frac{1}{T} \int_0^T e(t)dt$$

if it is necessary to know mean power P=|V||I| cos θ.

Conventional power measurement has been carried out as described above, and a compact and simply constructed circuit capable of detecting very small mean power in a broad band, has not been available.

DISCLOSURE OF INVENTION

Accordingly, an object of the present invention is to provide a compact and simply constructed analog multiplying-averaging circuit capable of highly precise detection in a broad band, in which multiplying-averaging of two input signals is achieved, as well as a wattmeter circuit which employs this circuit.

According to the present invention, the foregoing object is attained by providing an analog multiplying-averaging circuit characterized in that a first voltage signal is inputted to a base and a second voltage signal is inputted to a collector of one transistor circuit of a differential amplifier, a base and a collector of another transistor circuit are signally grounded.

According to the present invention, the foregoing object is attained by providing a wattmeter circuit characterized by comprising: an analog multiplying-averaging circuit in which a first voltage signal is inputted to a base and a second voltage signal is inputted to a collector of one transistor circuit of a differential amplifier, a base and a collector of another transistor circuit are signally grounded; an offset-voltage generating circuit in which a base of one transistor circuit of a differential amplifier is signally grounded, said second voltage signal is inputted to a collector of this transistor circuit, a base and a collector of another transistor circuit are signally grounded; and an output takeoff circuit for extracting a signal proportional to a difference between collector voltages of the other transistor circuits of said analog multiplying-averaging circuit and offset-voltage generating circuit.

And, in the analog multiplying-averaging circuit of the present invention, the first voltage signal is inputted to the base and the second voltage signal is inputted to the collector of one transistor circuit of the differential amplifier, thereby to supply to the collector a power corresponding to the multiplying-averaging of the two input signals. The base and collector of another transistor circuit are signally grounded, thereby to produce a junction temperature difference between the one transistor circuit and the other transistor circuit. As a result, a DC collector voltage corresponding to the junction temperature difference is obtained from the collector of the other transistor circuit.

Further, in the wattmeter circuit according to the present invention, the analog multiplying-averaging circuit is such that average power in the form {|V||I|cos θ+f(|V|)} is supplied to the collector of one transistor circuit of the circuit and a DC collector voltage corresponding to a junction temperature difference developed between this transistor circuit and another transistor circuit is extracted from collector of the other transistor circuit. The offset-voltage generating circuit is such that average power in the form {f|V|} is supplied to the collector of one transistor circuit and a DC collector voltage corresponding to a junction temperature difference developed between this transistor circuit and another transistor circuit is extracted from the collector of the other transistor circuit. The output takeoff circuit amplifies the difference between two DC collector voltages that have been extracted, and delivers a DC voltage signal proportional to the difference {|V| |I| cos θ} between the two supplied power signals.

BRIEF DESCRIPTION OF DRAWINGS

FIGS. 12 and 13 are diagrams for describing the derivation of the differential-mode signal equivalent circuit shown in FIG. 2.

BEST MODE FOR CARRYING OUT THE INVENTION

An embodiment in which the present invention is applied to a bipolar transistor will now be described in detail with reference to the accompanying drawings.

Figure 1:
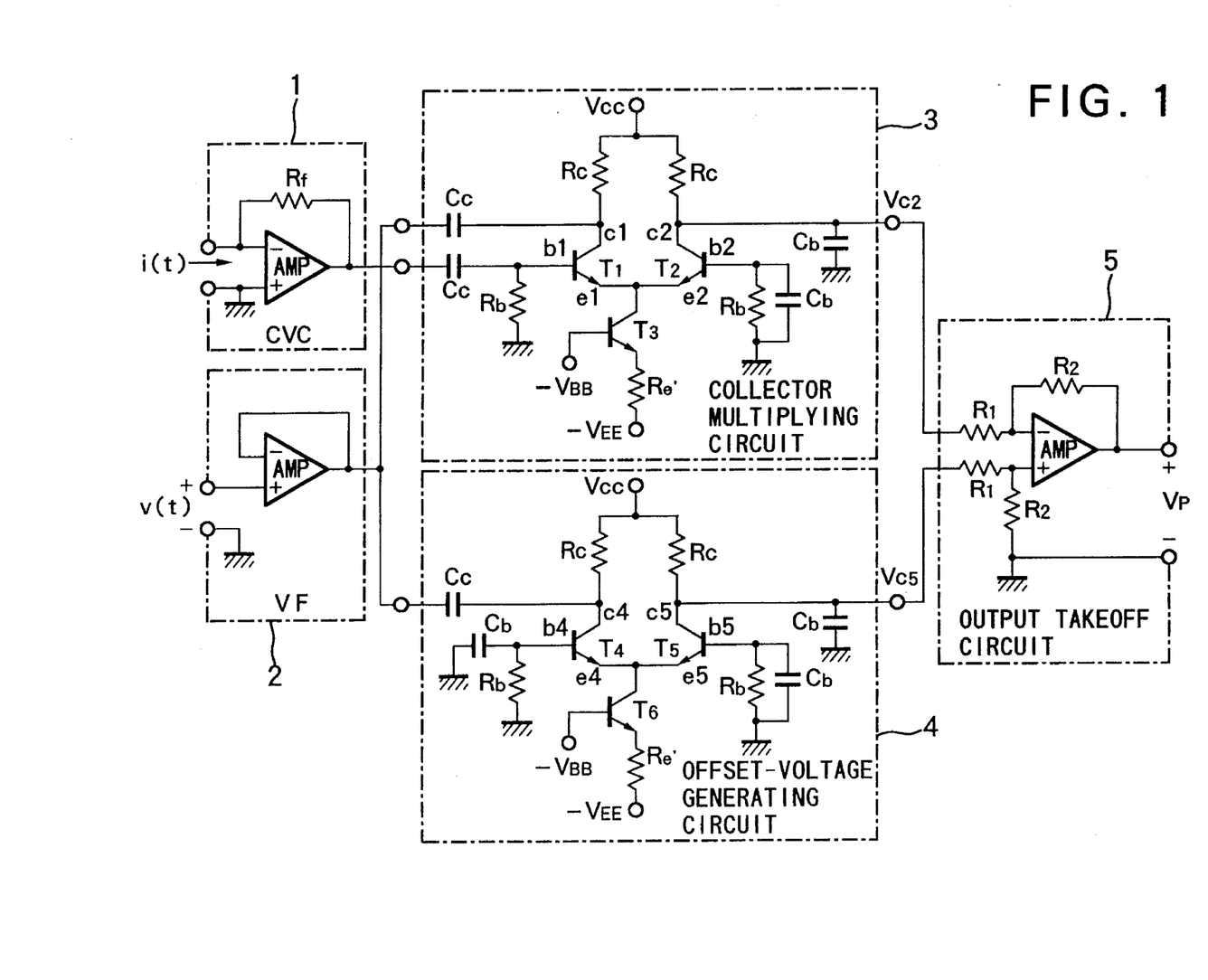
FIG. 1 is a circuit diagram showing a wattmeter circuit embodying the present invention.

FIG. 1 is a circuit diagram showing a wattmeter circuit embodying the present invention. In FIG. 1, a current i(t) is the current of an electric power to be measured, or a current proportional to this current, and a voltage v(t) likewise is the voltage of the electric power to be measured, or a voltage proportional to this voltage. The wattmeter includes a current/voltage converting circuit (CVC) 1 that converts the input current i(t) into a voltage source $\{-R_f i(t)\}$, a voltage follower (VF) 2 for outputting the voltage source v(t) that is the same as the input voltage v(t), a collector multiplying circuit (analog multiplying-averaging circuit) 3 so constructed that a signal at the voltage source $\{-R_f i(t)\}$ enters a base b1 of a transistor $T_1$, a signal at the voltage source v(t) enters a collector c1 of this transistor and a base b2 and collector c2' of a transistor $T_2$ are signally grounded, an offset-voltage generating circuit 4 so constructed that a base b4 of a transistor $T_4$ is signally grounded, the signal at the voltage source v(t) enters a collector c4 of this transistor and a base b5 and a collector c5 of a transistor $T_5$ are signally grounded, and an output takeoff circuit 5 which extracts a DC voltage signal $V_P$ proportional to the difference between DC collector voltages $V_{c2}$, $V_{c5}$ of the transistors $T_2$, $T_5$ in the collector multiplying circuit 5 and offset-voltage generating circuit 4, respectively.

It is preferred that these transistor circuits $T_1$ through $T_6$ be incorporated in the same IC chip made of silicon, for example, so that they will exhibit identical characteristics both electrically and thermally.

Figure 2:
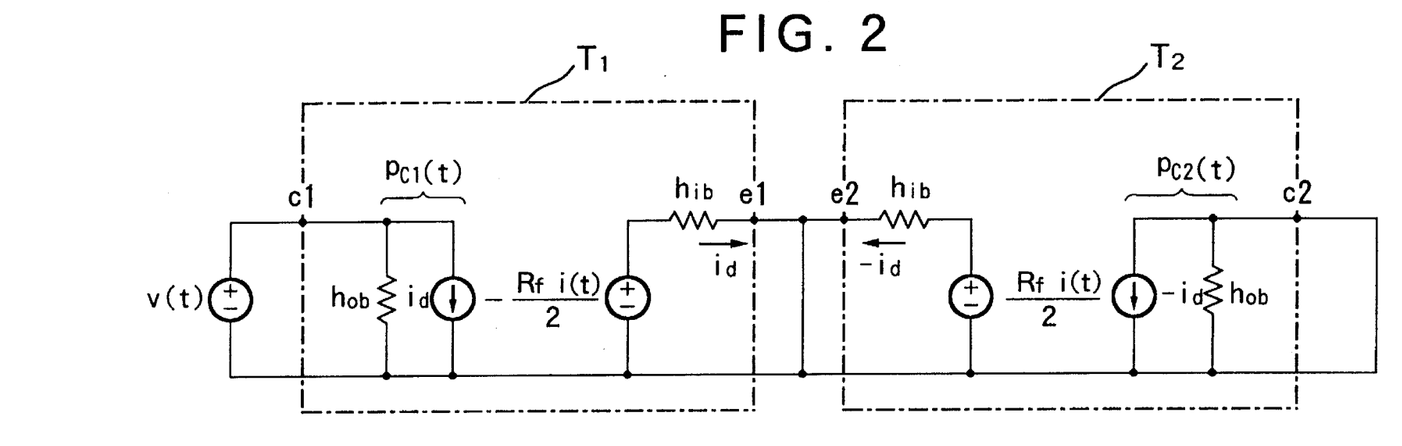
FIG. 2 is a circuit diagram illustrating a differential-mode signal equivalent circuit of a collector multiplying circuit 3.

FIG. 2 is a circuit diagram illustrating a differential-mode signal equivalent circuit of a collector multiplying circuit 5, and FIGS. 12 and 13 are diagrams for describing the derivation of FIG. 2. The derivation of the differential-mode signal equivalent circuit of FIG. 2 will now be described.

First, $C_c$ in FIG. 1 represents a coupling capacitor, and $C_b$ denotes a bypass capacitor. These capacitors can be regarded as being short-circuited with respect to the signal. Accordingly, the signal voltages $\{-R_f i(t)\}$ and v(t) are applied respectively to the base b1 and collector c1 of the transistor $T_1$, and the base b2 and collector c2 of the transistor $T_2$ are signally at ground potential.

The equivalent circuit of FIG. 12 is obtained if we let h parameters represent the foregoing and let $\alpha=1$, $h_{rb}=0$ hold. In FIG. 12, $R_e$ represents a high resistance exhibited by the emitter circuit of the transistor $T_3$. Since $\{-R_f i(t)\}$ in FIG. 12 is the voltage source, an identical voltage source $\{-R_f i(t)\}$ may be considered to be present in the block enclosed by the broken line of FIG. 12. Accordingly this circuit may be separated from the remaining circuitry at the potion indicated by the "x" mark in FIG. 12.

Accordingly, the equivalent circuit of FIG. 15 is obtained by cutting off the portion enclosed by the dot-dash-line of FIG. 12 and rewriting it. When the magnitudes of the voltage source $\{-R_f i(t)\}$ and a voltage source $\{\alpha i_{e1}/h_{ob}\}$ are compared, it is found that the following relation holds since $i_{e1}=-R_f i(t)/2h_{ib}$ holds true from the inequality $h_{ib} \ll R_e$ in FIG. 12.

$$\frac{-R_f i(t)}{i_{e1}/h_{ob}} = \frac{-R_f i(t)}{-R_f i(t)/2h_{ib}h_{ob}} = 2h_{ib}h_{ob}$$

where i(t)≠0.

Since $h_{ob}h_{ib}$ is actually very small, e.g., on the order of $10^{-4}$, the end result is that the voltage source $\{-R_f i(t)\}$ of FIG. 15 is very small in comparison with the voltage source $\{\alpha i_{e1}/h_{ob}\}$ and therefore is negligible.

Accordingly, the equivalent circuit representing the portion of collector c1 of transistor $T_1$ in FIG. 2 is obtained by rewriting the above circuit neglecting the voltage source $\{-R_f i(t)\}$ of FIG. 15.

It should be noted that, since $\{-R_f i(t)\}=0$ holds when i(t)=0 holds, the equivalent circuit representing the portion of collector c1 of the transistor $T_1$ in FIG. 2 is obtained as a matter of course.

Furthermore, input voltages $v_{b1}$, $V_{b2}$ to the respective base terminals b1, b2 may generally be represented by the sum of a common-mode signal and differential-mode signal as follows:

$$v_{b1} = \frac{R_f i(t)}{2} - \frac{R_f i(t)}{2} = -R_f i(t)$$

$$v_{b2} = \frac{R_f i(t)}{2} + \frac{R_f i(t)}{2} = 0$$

However, since it may be considered that the common-mode signal is not amplified because of the high resistance $R_e$, the following equations may be assumed to hold by taking into account only the differential-mode signal:

$$v_{b1} = \frac{R_f i(t)}{2}$$

$$v_{b2} = \frac{R_f i(t)}{2}$$

Furthermore, since the high resistance $R_e$ of FIG. 12 may be considered to represent a short circuit with regard to the differential-mode signal, the differential-mode signal equivalent circuit of FIG. 2 is obtained.

Next, the collector multiplying effect in the transistor $T_1$ will be described based upon the differential-mode signal equivalent circuit in FIG. 2. In FIG. 2, a signal current $i_d = -R_f i(t)/2h_{ib}$ flows into the emitter $e_1$ of the transistor $T_1$ owing to the fact that $v_{b1}=-R_f i(t)/2$ holds. In addition, since $\alpha=1$ holds, an identical current $i_d$ is drawn from the collector c1 of the transistor $T_1$. On the other hand, the signal voltage v(t) is being impressed upon the collector c1 of the transistor $T_1$, and therefore instantaneous power $p_{c1}(t)$ supplied to the collector c1 of transistor $T_1$ is expressed as follows:

$$p_{c1}(t) = \frac{R_f}{2h_{ib}} i(t)v(t) + h_{ob}v^2(t) \quad (1)$$

Thus, the multiplying effect of the collector in the transistor $T_1$ is indicated by the first term on the right side of Equation (1). Since the second term on the right side of this equation is superfluous, an identical power loss is generated in the offset-voltage generating circuit 4, described below, so as to cancel the second term. On the other hand, since the signal voltage v(t) is not being impressed upon the collector c2 of transistor $T_2$, instantaneous power $p_{c2}(t)$ supplied to the collector c2 of transistor $T_2$ is equal to zero.

If we let $v(t)=V_m\cos\omega t$ and $i(t)=I_m\cos(\omega t+\theta)$ represent each of the input signals, we have:

$$p_{c1}(t) = \frac{R_f}{2h_{ib}} V_m I_m \cos\omega t \cos(\omega t + \theta) + h_{ob}V_m^2 \cos^2\omega t \quad (2)$$

Arranging this in the form of a trigonometric equation, we have:

$$p_{c1}(t) = \frac{R_f}{2h_{ib}} \frac{V_m I_m}{2} \cos\theta + \frac{h_{ob}V_m^2}{2} - \frac{R_f}{2h_{ib}} \frac{V_m I_m}{2} \cos(2\omega t + \theta) + \frac{h_{ob}V_m^2}{2} \cos 2\omega t \quad (3)$$

Since the terms on the first line of the right side of Equation (3) represent a DC component, these terms apply average power to the collector of transistor $T_1$. However, since the terms on the second line represent a $2_{\omega}$ component, these do not apply average power to the collector of transistor $T_1$.

Figure 3:
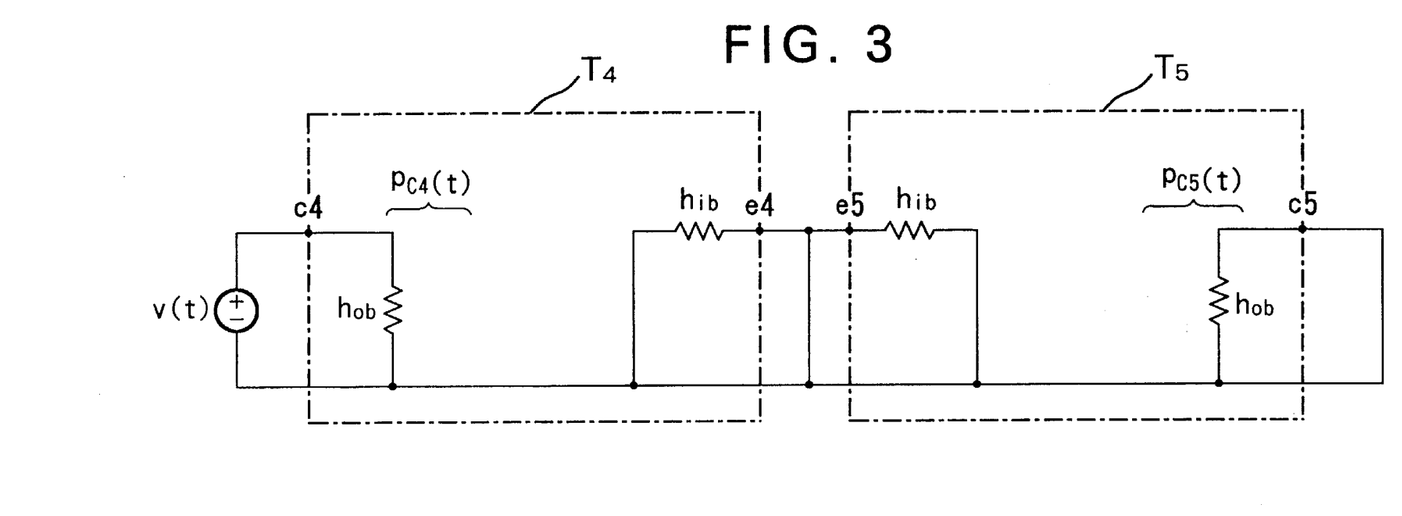
FIG. 3 is a circuit diagram illustrating a differential-mode signal equivalent circuit of an offset-voltage generating circuit 4.

FIG. 5 is a circuit diagram showing a differential-mode signal equivalent circuit of the offset-voltage generating circuit 4. According to FIG. 1, since the base inputs to the transistors $T_4$ and $T_5$ are both at ground potential, the differential input is equal zero in FIG. 5 and therefore the potion relating to the signal current $i_d$ also is zero. On the other hand, the signal voltage $v(t)$ is being applied to the collector c4 of transistor $T_4$, and therefore instantaneous power $p_{c4}(t)$ supplied to the collector c4 of transistor $T_4$ is expressed as follows:

$$p_{c4}(t)=h_{ob}v^2(t) \quad (4)$$

Further, since the signal voltage $v(t)$ is not being applied to the collector c5 of transistor $T_5$, instantaneous power $p_{c5}(t)$ supplied to the collector c5 of transistor $T_5$ is equal to zero.

Furthermore, if the input signal is expressed by $v(t)=V_m\cos\omega t$ and rearranging is performed in a manner similar to that described above, we have:

$$p_{c4}(t) = \frac{h_{ob}V_m^2}{2} + \frac{h_{ob}V_m^2}{2} \cos 2\omega t \quad (5)$$

Since the first term on the right side of Equation (5) is a DC component, this term applies average power to the collector of transistor $T_4$. However, since the second term is a $2_{\omega}$ component, this does not apply average power to the collector of transistor $T_4$.

Thus, in accordance with Equation (3), signal (average) power $\Delta P_{c1}$, expressed by the following equation, is supplied to the collector c1 of transistor $T_1$:

$$\Delta P_{c1} = \frac{R_f}{2h_{ib}} \frac{V_m I_m}{2} \cos\theta + \frac{h_{ob}V_m^2}{2} \quad (6)$$

In accordance with Equation (5), signal (average) power $\Delta P_{c4}$, expressed by the following equation, is supplied to the collector c4 of the transistor $T_4$:

$$\Delta P_{c4} = \frac{h_{ob}V_m^2}{2} \quad (7)$$

In addition, the temperature at the junction of transistors $T_1$ and $T_2$ varies owing to the signal power $\Delta P_{c1}$, a heat flow occurs due to a difference in the power losses between the transistors $T_1$ and $T_2$, and a DC collector voltage $V_{c2}$ corresponding to this change in junction temperature appears at the collector c2 of transistor $T_2$. Similarly, the temperature at the junction of transistors $T_4$ and $T_5$ varies owing to the signal power $\Delta P_{c4}$, a heat flow occurs due to a difference in the power losses between the transistors $T_4$ and $T_5$, and a DC collector voltage $V_{c5}$ corresponding to this change in junction temperature appears at the collector c5 of transistor $T_5$. Accordingly, true average power corresponding to the difference between $\Delta P_{c1}$ and $\Delta P_{c4}$ can be determined by detecting the difference between $V_{c2}$ and $V_{c5}$. This process will be described below.

Figure 4:
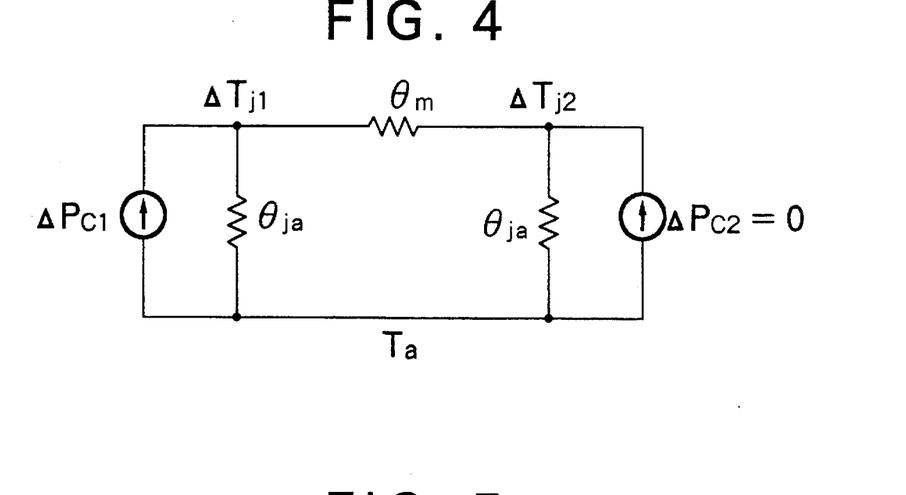
FIG. 4 is a circuit diagram illustrating a thermal equivalent circuit of transistors $T_1$ and $T_2$.

FIG. 4 is a circuit diagram showing a thermal equivalent circuit of the transistors $T_1$ and $T_2$. Shown in FIG. 4 are signal powers $\Delta P_{c1}$, $\Delta P_{c2}$, amounts of change $\Delta T_{j1}$, $\Delta T_{j2}$ in junction temperature due to signal power, a thermal resistance $\theta_m$ between junctions, and thermal resistance $\theta_{ja}$ between the junctions and ambient air. Since $\Delta P_{c2}=0$ holds in accordance with the foregoing, the common-mode signal component of the signal power may be represented by $\Delta P_{c1}/2$ and differential-mode signal component by $\pm\Delta P_{c1}/2$. As a result, the thermal equivalent circuit of FIG. 4 can be considered upon being separated into a common-mode signal thermal equivalent circuit shown in FIG. 5 and a differential-mode signal thermal equivalent circuit shown in FIG. 6.

Figure 5:
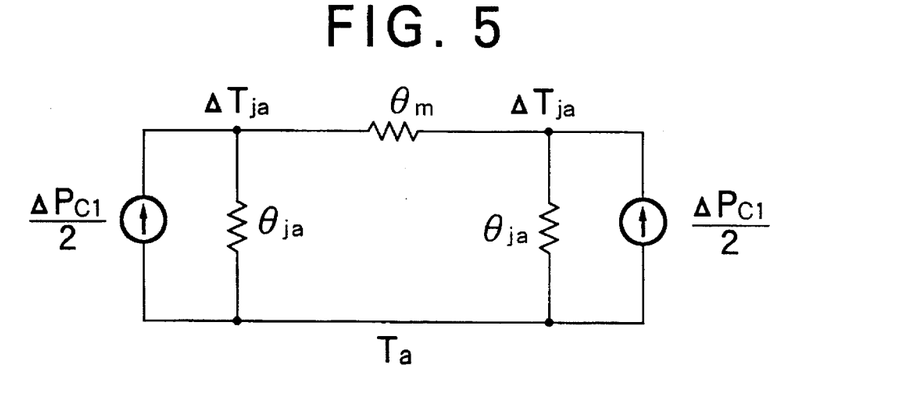
FIG. 5 is a circuit diagram illustrating a common-mode signal thermal equivalent circuit in transistors $T_1$ and $T_2$.

If the common-mode signal thermal equivalent circuit of FIG. 5 is solved, the amount of change $\Delta T_{ja}$ in the junction temperature will be as follows:

$$\Delta T_{ja} = \frac{\Delta P_{c1}}{2} \theta_{ja} \quad (8)$$

Figure 6:
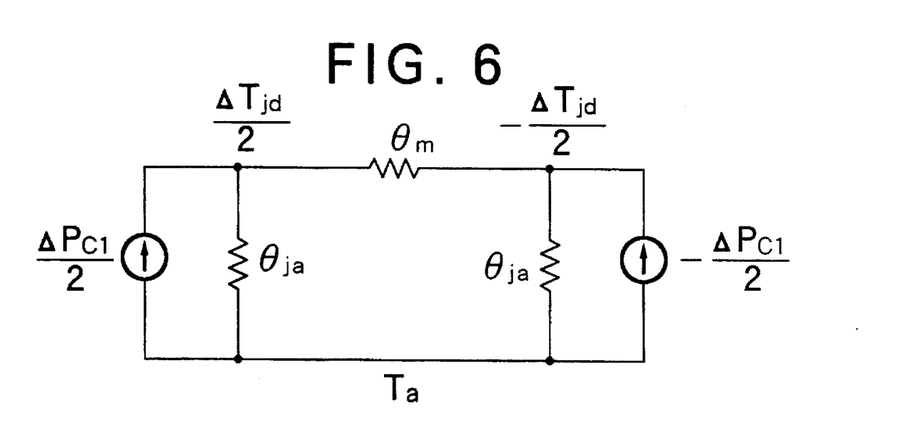
FIG. 6 is a circuit diagram illustrating a differential-mode signal thermal equivalent circuit in transistors $T_1$ and $T_2$.

If the differential-mode signal equivalent circuit of FIG. 6 is solved, the amount of change $\Delta T_{jd}/2$ in the junction temperature will be as follows:

$$\frac{\Delta T_{jd}}{2} = \frac{\Delta P_{c1}}{2} \frac{\theta_{ja} \theta_m}{2\theta_{ja} + \theta_m} \quad (9)$$

Accordingly, by substituting Equation (6) in $\Delta P_{c1}$ of Equation (9) and rearranging, the junction temperature difference $\Delta T_{jd}$ between the junctions of transistors $T_1$ and $T_2$ may be expressed as follows:

$$\Delta T_{jd} = \left[\frac{R_f}{2h_{ib}} \frac{V_m I_m}{2} \cos\theta + \frac{h_{ob}V_m^2}{2}\right]\left[\frac{\theta_{ja} \theta_m}{2\theta_{ja} + \theta_m}\right] \quad (10)$$

Figure 11:
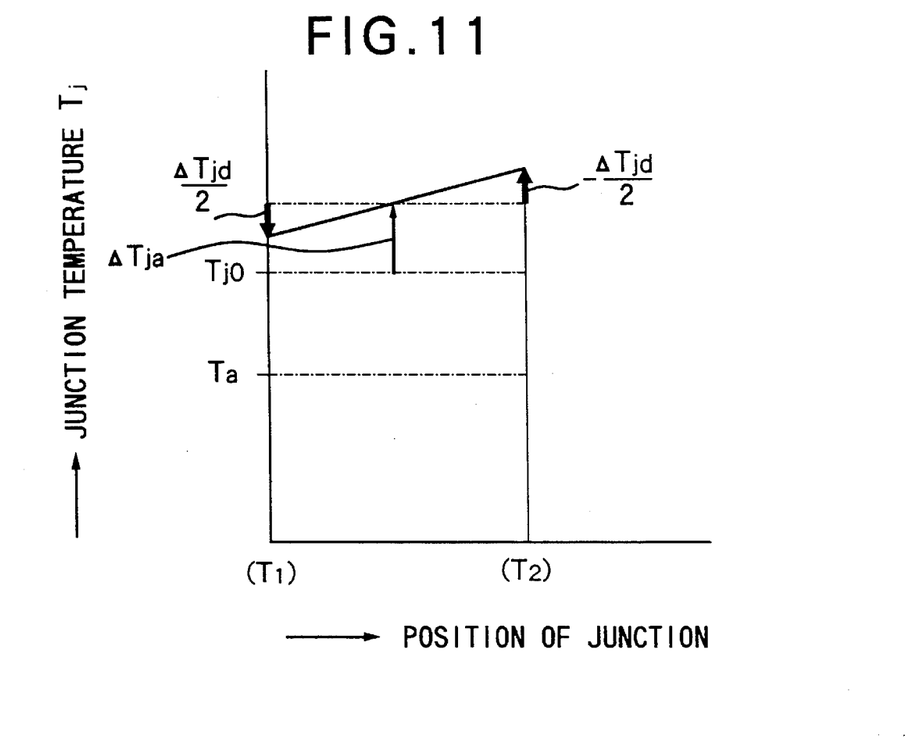
FIG. 11 is a graph showing a relationship between the position of the junction of transistors $T_1$, $T_2$ and the temperature at this junction.

FIG. 11 is a graph showing the relationship between the position of the junction of transistors $T_1$, $T_2$ and the temperature at this junction. In FIG. 11, $T_a$ represents ambient temperature and $T_{jo}$ represents the junction temperature in the absence of a signal. These are related by the following equation:

$$T_{jo}=T_a+\theta_{ja}P_c$$

where $P_c$ represents collector loss in the absence of a signal. Since the change in junction temperature due to the signal power is added to this, the junction temperatures $T_{j1}, T_{j2}$ of the transistors $T_1$, $T_2$ may be expressed by following equations:

$$T_{j1} = T_{jo} + \Delta T_{ja} + \frac{\Delta T_{jd}}{2} \quad (11)$$

$$T_{j2} = T_{jo} + \Delta T_{ja} - \frac{\Delta T_{jd}}{2} \quad (12)$$

Thus, when the junction temperatures of the transistors $T_1$, $T_2$ change, the base-to-emitter voltages of the transistors $T_1$, $T_2$ change. The process for obtaining the DC collector voltage $V_{c2}$ corresponding to this change will be described below.

Figure 7:
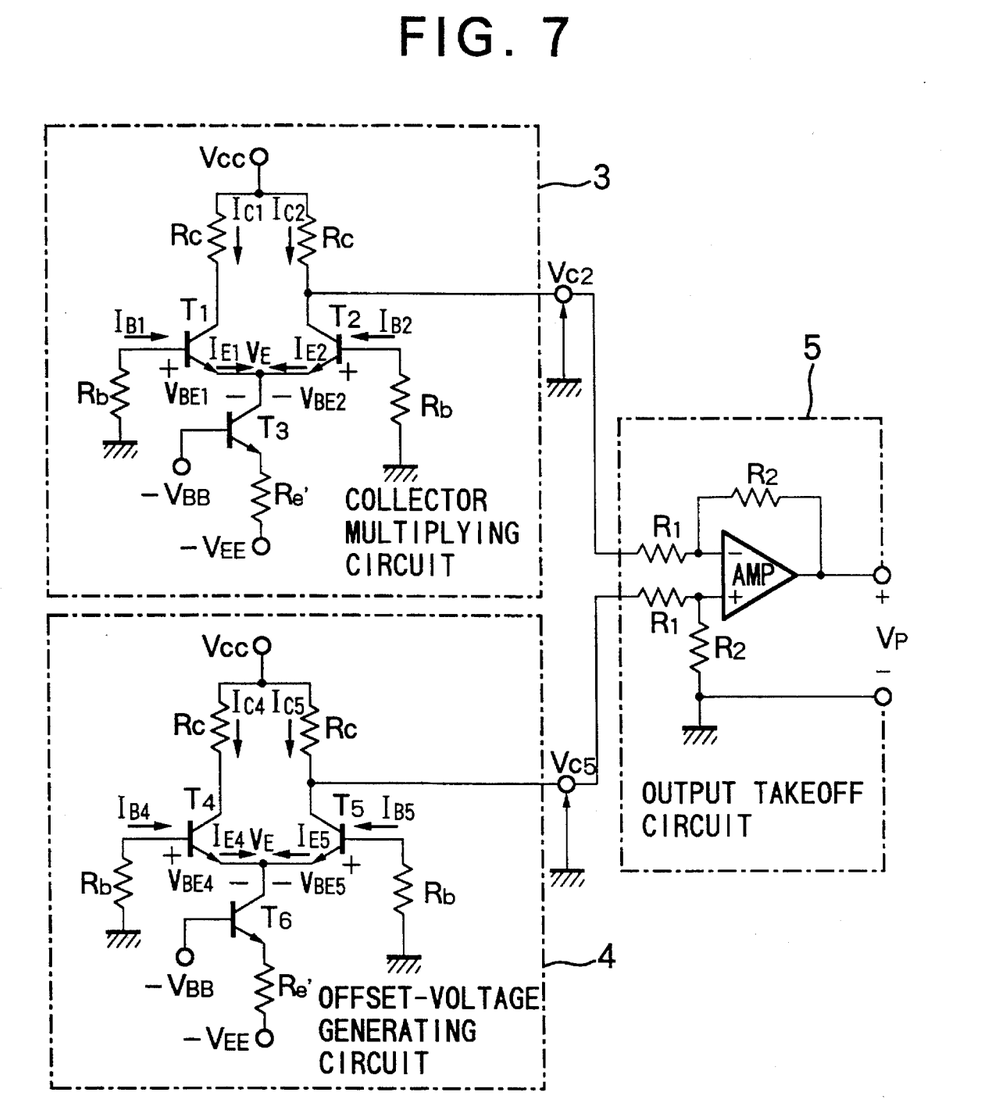
FIG. 7 is a circuit diagram illustrating a DC operation of a wattmeter circuit.

FIG. 7 is a circuit diagram illustrating the DC operation of the wattmeter circuit according to this embodiment. Signals indicated in FIG. 7 include direct currents $I_E$, $I_B$, $I_C$, an emitter voltage $V_E$ and a base-emitter voltage $V_{BE}$.

In the collector multiplying circuit 5 of FIG. 7, the collector potential $V_{c2}$ of transistor $T_2$ is given by the following:

$$V_{c2} = V_{cc} - R_c I_{c2} - R_c \Delta I_{c2} \quad (13)$$

Here $\Delta I_{c2}$ represents the amount of change in the collector current of the transistor $T_2$ due to a change in junction temperature and is obtained as set forth below.

In general, since the base-emitter voltage of a transistor is a function of junction temperature, emitter current and base-collector voltage, we have the following relations:

$$V_{BE1} = f_1(T_{j1}, I_{E1}, V_{CB1})$$

$$V_{BE2} = f_2(T_{j2}, I_{E2}, V_{CB2})$$

The amounts of change in these voltages may be expressed as follows in approximate terms:

$$\Delta V_{BE1} = \frac{\delta V_{BE1}}{\delta T_{j1}} \Delta T_{j1} + \frac{\delta V_{BE1}}{\delta I_{E1}} \Delta I_{E1} + \frac{\delta V_{BE1}}{\delta V_{CB1}} \Delta V_{CB1} \quad (14)$$

$$\Delta V_{BE2} = \frac{\delta V_{BE2}}{\delta T_{j2}} \Delta T_{j2} + \frac{\delta V_{BE2}}{\delta I_{E2}} \Delta I_{E2} + \frac{\delta V_{BE2}}{\delta V_{CB2}} \Delta V_{CB2}$$

Accordingly, owing to the fact that the characteristics of the transistors $T_1$ and $T_2$ are identical, and by assuming that the following holds:

$$\kappa = \frac{\delta V_{BE1}}{\delta T_{j1}} = \frac{\delta V_{BE2}}{\delta T_{j2}} \quad (15)$$

$$h_{ib} = \frac{\delta V_{BE1}}{\delta I_{E1}} = \frac{\delta V_{BE2}}{\delta I_{E2}}$$

$$h_{rb} = \frac{\delta V_{BE1}}{\delta V_{CB1}} = \frac{\delta V_{BE2}}{\delta V_{CB2}} = 0$$

the following relation is obtained from Equation (14):

$$\Delta V_{BE2} = \kappa(\Delta T_{j1} - \Delta T_{j2}) + h_{ib}(\Delta I_{E1} - \Delta I_{E2}) \quad (16)$$

This describes the temperature characteristics of the transistors $T_1$ and $T_2$.

In the collector multiplying circuit S shown in FIG. 7, the following relations hold:

$$V_{BE1} = -R_b I_{B1} - V_E \quad (17)$$

$$V_{BE2} = -R_b I_{B2} - V_E$$

and the following relation is obtained from Equation (17):

$$V_{BE1} - V_{BE2} = -R_b(I_{B1} - I_{B2}) \quad (18)$$

With regard to the amounts of change in these voltages, the following relation is obtained:

$$\Delta V_{BE1} - \Delta V_{BE2} = -R_b(\Delta I_{B1} - \Delta I_{B2}) \quad (19)$$

When this is substituted in Equation (16), the following relation is obtained:

$$-R_b(\Delta I_{B1} - \Delta I_{B2}) = \kappa(\Delta T_{j1} - \Delta T_{j2}) + h_{ib}(\Delta I_{E1} - \Delta I_{E2}) \quad (20)$$

This describes the temperature dependence of the collector multiplying circuit 3.

Furthermore, the following relations hold with regard to the transistors $T_1$ and $T_2$:

$$\Delta I_{B1} = \Delta I_{c1}/h_{FE}$$

$$\Delta I_{B2} = \Delta I_{c2}/h_{FE}$$

and it was assumed that $\alpha = 1$ holds. In addition, if $I_{CBO} = 0$, $h_{ob} = 0$ are assumed to hold, then $\Delta I_{c1} = \Delta I_{E1}$, $\Delta I_{C2} = \Delta I_{E2}$ can be regarded as holding. Therefore, when relations above are applied to Equation (20) and this equation is solved with regard to $(\Delta I_{C1} - \Delta I_{C2})$, the following is obtained:

$$\Delta I_{C1} - \Delta I_{C2} = \frac{-\kappa(\Delta T_{j1} - \Delta T_{j2})}{R_b/h_{FE} + h_{ib}} \quad (21)$$

Furthermore, since $\Delta T_{j1} - \Delta T_{j2} = \Delta T_{jd}$ holds and $\Delta I_{C1} = -\Delta I_{c2}$ is established owing to the sufficiently stable current operation of the transistor $T_3$, the amount of change $\Delta I_{c2}$ in the collector current of the transistor $T_2$ may be expressed as follows:

$$\Delta I_{C2} = \frac{\kappa \Delta T_{jd}}{2(R_b/h_{FE} + h_{ib})} \quad (22)$$

By expressing the power to be measured, namely the average power, as follows:

$$P = \frac{V_m I_m}{2} \cos\theta \quad (23)$$

and substituting Equation (10) in $\Delta T_{jd}$ of Equation (22), the following equation is obtained:

$$\Delta I_{C2} = \quad (24)$$

$$\frac{\kappa}{2(R_b/h_{FE} + h_{ib})} \left[ -\frac{R_f}{2h_{ib}} P + \frac{h_{ob} V_m^2}{2} \right] \left[ \frac{\theta_{ja} \theta_m}{2\theta_{ja} + \theta_m} \right]$$

On the other hand, in the offset-voltage generating circuit 4 of FIG. 7, the collector potential $V_{c5}$ of transistor $T_5$ is given by the following:

$$V_{c5} = V_{cc} - R_c I_{c5} - R_c \Delta I_{c5} \quad (25)$$

and the signal power supplied to the transistor $T_4$ is as expressed by Equation (7). Therefore, $\Delta I_{C5}$ may be expressed as follows in a manner similar to that set forth above:

$$\Delta I_{C5} = \frac{\kappa}{2(R_b/h_{FE} + h_{ib})} \cdot \frac{h_{ob} V_m^2}{2} \left[ \frac{\theta_{ja} \theta_m}{2\theta_{ja} + \theta_m} \right] \quad (26)$$

The output takeoff circuit 5 differentially amplifies $V_{c2}$ and $V_{c5}$ and the output voltage $V_P$ thereof is given by the following:

$$V_P = (V_{C5} - V_{C2}) \frac{R_2}{R_1} \quad (27)$$

Also, since these transistors $T_1$ through $T_6$ are chosen to have identical characteristics, we have $I_{c2}=I_{c5}$. Accordingly, we have:

$$V_P = R_c(\Delta I_{C2} - \Delta I_{C5}) \frac{R_2}{R_1} \quad (28)$$

Now, substituting Equations (24), (26) in Equation (28), we may write $V_P$ as follows:

$$V_P = \frac{-R_c \kappa}{2(R_b/h_{FE} + h_{ib})} \left[ \frac{R_f}{2h_{ib}} P \right] \left[ \frac{\theta_{ja}\theta_m}{2\theta_{ja} + \theta_m} \right] \frac{R_2}{R_1} \quad (29)$$

Furthermore, if sensitivity S is defined as follows:

$$S = \frac{-\kappa R_c R_f}{4(R_b/h_{FE} + h_{ib})h_{ib}} \left[ \frac{\theta_{ja}\theta_m}{2\theta_{ja} + \theta_m} \right]$$

then the output DC voltage $V_P$ may be expressed by the following equation:

$$V_P = S \frac{R_2}{R_1} P \quad (30)$$

Thus it is clear that the output DC voltage $V_P$ is proportional to the power P to be measured.

Figure 8:
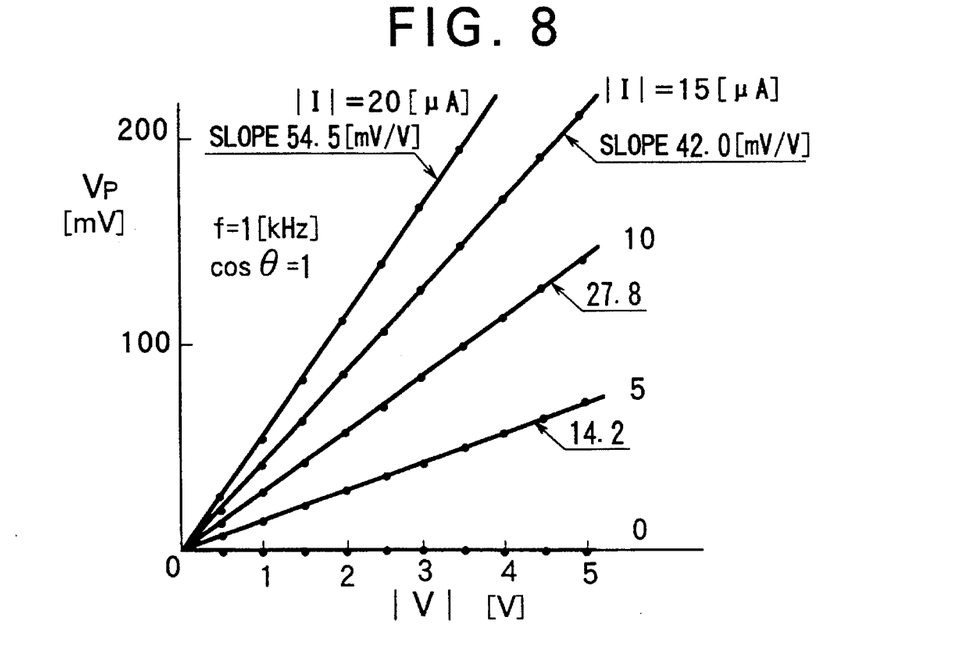
FIG. 8 is a plot of an output DC voltage vs an input AC voltage for input AC currents.
Figure 9:
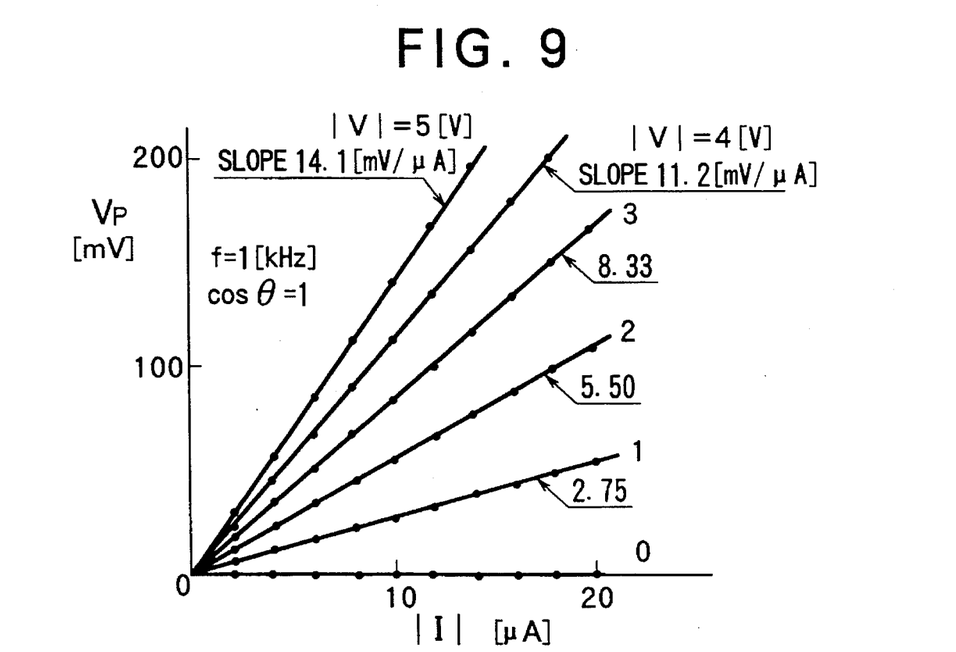
FIG. 9 is a plot of an output DC voltage vs an input AC current for input AC voltages.

FIG. 8 is a graph in which output DC voltage is plotted against input AC voltage, and FIG. 9 is a graph in which output DC voltage is plotted against input AC current. In FIGS. 8 and 9, |V|, |I| are effective values. In both of these figures, the input/output characteristics may be regard as being substantially linear for an input AC voltage |V| of not more than 5V and an input AC current |I| of not more than 15 μA. When the sensitivity S is found from the slope of straight line, the results shown in Tables 1 and 2 are obtained.

TABLE 1

| |I| [μA] | S [mV/μW] |
| --- | --- |
| 20 | 0.136 |
| 15 | 0.140 |
| 10 | 0.139 |
| 5 | 0.142 |
| Mean of S | 0.139 |

TABLE 2

| |V| [V] | S [mV/μW] |
| --- | --- |
| 5 | 0.141 |
| 4 | 0.140 |
| 3 | 0.139 |
| 2 | 0.138 |
| 1 | 0.138 |
| Mean of S | 0.139 |

Table 1 and 2 indicate that the values of sensitivity S are substantially agree in all cases and that the actually measured value of sensitivity S is 0.139 mV/μW.

Figure 10:
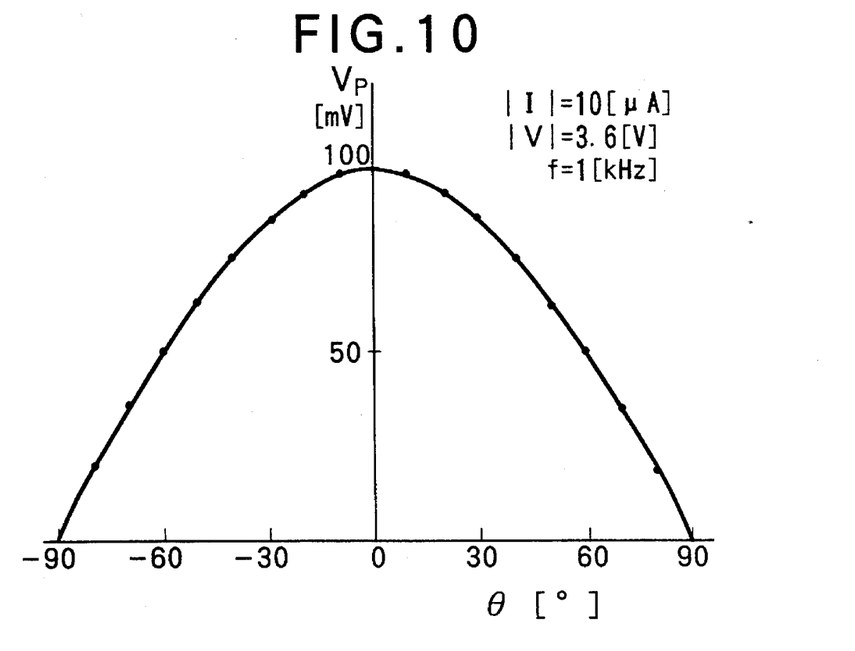
FIG. 10 is a plot of an output DC voltage vs phase difference θ between |V| and |I|.

FIG. 10 is a graph in which the output DC voltage is plotted against the phase difference between |V| and |I|. The phase difference between |V| and |I| also can be expressed in the form $V_P$=100 cos θ[mV], and the output DC voltage $V_P$ is proportional to cos θ. Accordingly, the wattmeter circuit can be utilized to measure phase difference as well as power factor.

In the embodiment described above, the collector multiplying circuit 5 and the offset-voltage generating circuit 4 operate under identical conditions, and therefore a substantial offset effect is observed even in the non-linear range of the transistor characteristics.

Further, in the foregoing embodiment, the current/voltage converting circuit (CVC) 1 is employed to detect the signal i(t). This means that the input impedance may be regarded as 0 (not more than 0.1 Ω), so that even a very small load current is capable of being detected in accurate fashion.

In the foregoing embodiment, the voltage follower (VF) 2 is employed to detect the signal v(t). Since the input impedance of the voltage follower is very large, e,g., on the order of $10^9$ Ω, voltage can be detected accurately without the load being influenced.

Though i(t), v(t) are employed as the input signals in the foregoing embodiment, the present invention can be applied even in the case of other types of signals provided the signal is converted to a voltage source.

Further, though a case in which an NPN transistor is used is described in the foregoing embodiment, it is obvious that a PNP transistor may be used as well.

In accordance with the present invention, as described above, the arrangement is such that a first voltage signal is inputted to the base of one transistor circuit of a differential amplifier circuit, a second voltage signal is inputted to the collector thereof and the base and collector of another transistor circuit of the differential amplifier are signally grounded. As a result, an effect through which two inputs are multiplied is obtained at the collector of the one transistor circuit, and a DC voltage corresponding to the multiplying-averaging of the two inputs is extracted continuously from the collector of the other transistor circuit. Accordingly, it is possible to provide a compact and simply constructed analog multiplying-averaging circuit capable of highly precise detection over a wide band.

Further, in accordance with the invention, the analog multiplying-averaging circuit is such that average power in the form [|V||I| cos θ+f(|V|)} is supplied to the collector of one transistor circuit of the circuit and a DC collector voltage corresponding to a junction temperature difference developed between this transistor circuit and another transistor circuit is extracted from collector of the other transistor circuit. The offset-voltage generating circuit is such that average power in the form {f|V|} is supplied to the collector of one transistor circuit and a DC collector voltage corresponding to a junction temperature difference developed between this transistor circuit and another transistor circuit is extracted from the collector of the other transistor circuit. The output takeoff circuit amplifies the difference between two DC collector voltages that have been extracted, and delivers a DC voltage signal proportional to the difference {|V| |I| cos θ} between the two supplied power signals. As a result, a compact, precise wattmeter capable of highly precise detection over a wide band can be provided at low cost.

As many apparently widely different embodiments of the present invention may be made without departing from the spirit and scope thereof, it is to be understood that the invention is not limited to the specific embodiments thereof except as defined in the appended claims.

We claim:

1. A two-input product averaging circuit comprising:

a differential amplifier including a first transistor circuit having a collector, an emitter and a base, and a second transistor circuit having a collector, an emitter and a base, a first voltage signal being inputted to the base of the first transistor circuit and a second voltage signal being inputted to the collector of said first transistor circuit, the base and the collector of said second transistor circuit being grounded with respect to input signals, so that a first signal power proportional to an average value of the product of the first and second voltage signals together is supplied across the collector and the emitter of said first transistor circuit and a second signal power of zero is supplied across the collector and the emitter of said second transistor circuit, and thereby a temperature difference proportional to a difference between said first and second signal powers is produced across each junction of said first and second transistor circuits and direct currents generated by said temperature difference flow into the respective collectors of said first and second transistor circuits, wherein a DC collector voltage based upon said direct currents and corresponding to the average value of the product of the first and second voltage signals is extracted from said differential amplifier.

2. A two-input product averaging circuit comprising:

a collector multiplying circuit including a first differential amplifier which includes a first transistor circuit having a collector, an emitter and a base, and a second transistor circuit having a collector, an emitter and a base, a first voltage signal being inputted to the base of the first transistor circuit and a second voltage signal being inputted to the collector of said first transistor circuit, the base and the collector of said second transistor circuit being grounded with respect to input signals so that a first signal power proportional to an average value of a product of the first and second voltage signals together is supplied across the collector and the emitter of said first transistor circuit and a second signal power of zero is supplied across the collector and the emitter of said second transistor circuit, and thereby a first temperature difference proportional to a difference between said first and second signal powers is produced across each junction of said first and second transistor circuits and direct currents generated by said first temperature difference flow into the respective collectors of said first and second transistor circuits, wherein a first DC collector voltage based upon said direct currents and corresponding to the average value of the product of the first and second voltage signals is extracted from the collector of said second transistor circuit;

an offset-voltage generating circuit including a second differential amplifier which includes a third transistor circuit having a collector, an emitter and a base, and a fourth transistor circuit having a collector, an emitter and a base, said second voltage signal being inputted to the collector of said third transistor circuit, the base of said third transistor circuit being grounded with respect to input signals, and the base and the collector of said fourth transistor circuit being grounded with respect to input signals so that a third signal power proportional to an average value of the square of the second voltage signal is supplied across the collector and the emitter of said third transistor circuit and a fourth signal power of zero is supplied across the collector and the emitter of said fourth transistor circuit, and thereby a second temperature difference proportional to a difference between said third and fourth signal powers is produced across each junction of said third and fourth transistor circuits and direct currents generated by said second temperature difference flow into the respective collectors of said third and fourth transistor circuits, wherein a second DC collector voltage based upon said direct currents and corresponding to the average value of the square of the second voltage signal is extracted from the collector of said fourth transistor circuit; and an output takeoff circuit coupled to said collector of said second transistor circuit and said collector of said fourth transistor circuit for extracting a DC voltage signal proportional to a difference between the first and second DC collector voltages.

3. A two-input product averaging circuit comprising:

a collector multiplying circuit including a first differential amplifier including a first transistor circuit having a collector, an emitter and a base, and a second transistor circuit having a collector, an emitter and a base, a first voltage signal being inputted to the base of the first transistor circuit and a second voltage signal being inputted to the collector of said first transistor circuit, the base and the collector of said second transistor circuit being grounded so that a first DC collector voltage caused by a junction temperature difference produced between said first and second transistor circuits is generated at the collector of said second transistor circuit;

an offset voltage generating circuit including a second differential amplifier including a third transistor circuit having a collector, an emitter and a base, and a fourth transistor circuit having a collector, an emitter and a base, said second voltage signal being inputted to the collector of said third transistor circuit, the base of said third transistor circuit being grounded with respect to input signals, and the base and the collector of said fourth transistor circuit being grounded with respect to input signals so that a second DC collector voltage caused by a junction temperature difference produced between said third and fourth transistor circuits is generated at the collector of said fourth transistor circuit; and an output takeoff circuit coupled to said collector of said second transistor circuit and said collector of said fourth transistor circuit, respectively, to receive therefrom said first DC collector voltage and said second DC collector voltage and producing a DC voltage signal proportional to a difference between said first DC collector voltage and said second DC collector voltage.

* * * * *